United States Patent [19]

Robinson et al.

[11] Patent Number: 5,423,695
[45] Date of Patent: Jun. 13, 1995

[54] WATTHOUR METER SOCKET ADAPTER WITH TAMPER RESISTANT RING

[75] Inventors: Darrell Robinson, Highland, Mich.; John T. Shincovich, North Canton; Michael E. Lewis, Ann Arbor, Mich.

[73] Assignee: Ekstrom Industries, Inc., Farmington Hills, Mich.

[21] Appl. No.: 130,265

[22] Filed: Oct. 1, 1993

[51] Int. Cl.6 .......................................... H01R 33/945
[52] U.S. Cl. ................................. 439/517; 439/95; 324/110
[58] Field of Search ................. 439/517, 95, 101, 102, 439/100, 105, 106, 107, 108; 361/366–368, 372, 373; 324/156, 110; 29/842, 845, 876

[56] References Cited

U.S. PATENT DOCUMENTS

| | | | |
|---|---|---|---|
| 4,175,813 | 11/1979 | Mentesana | 324/110 |
| 4,795,975 | 1/1989 | Cox | 324/156 |
| 5,027,061 | 6/1991 | Palmer et al. | 324/110 |
| 5,088,004 | 2/1992 | Howell | 439/517 |

Primary Examiner—Larry I. Schwartz
Assistant Examiner—Hien D. Vu
Attorney, Agent, or Firm—Basile and Hanlon

[57] ABSTRACT

A hardened metallic ring is mounted over the exterior sidewall of the shell portion of a watthour meter socket adapter. The ring has overlapped ends which are welded together to form a circular ring with a diameter approximate the diameter of the shell. In another embodiment, a radially outward flange is formed on one annular edge of the ring to cover a peripheral edge flange of the base of the socket adapter.

19 Claims, 3 Drawing Sheets

WATTHOUR METER SOCKET ADAPTER WITH TAMPER RESISTANT RING

BACKGROUND OF THE INVENTION

1. Field of the Invention

The present invention relates, in general, to automatic watthour meter reading apparatus and, specifically, to watthour meter socket adapters.

2. Description of the Art

In the electric utility industry, plug-in, socket-type watthour meters are commonly used to measure electric power consumption at residential or commercial sites. A socket housing is mounted on a convenient wall of the residence or commercial building and contains pairs of line and load terminals which are respectively connected to electric line and load conductors. The terminals receive blade contacts on a plug-in watthour meter to complete an electric circuit through the meter between the line and load terminals.

Plug-in socket adapters and socket adapters/extenders, both hereafter referred to simply as socket adapters, are designed to plug into the meter socket housing terminals. Such socket adapters are employed to convert ringless style sockets to ring style sockets or to extend the mounting position of the jaw terminals in the socket housing outward from the socket housing for mounting various electrical equipment, such as test devices or survey recorders, in the socket housing.

Such socket adapters employ a generally annular base having a shell joined thereto and extending outward from one side of the base. Contacts are mounted in the shell and base. Each contact has a female jaw portion disposed interiorly within the shell and a male blade terminal connected to the female jaw portion and extending outward from the shell and the base for a plug-in connection to the terminals in the meter socket housing.

Such socket adapters may be employed in both ring style and ringless style socket housings. In a ring style housing, a raised mounting flange is formed on the front cover of the socket housing to which the peripheral edge of the base of the socket adapter mates and is locked thereto by means of a conventional, annular, lockable sealing ring. In a ringless style socket housing, the peripheral edge flange of the base of the socket adapter is disposed interiorly within the socket housing in close proximity to or engagement with a raised annular portion of the cover surrounding an aperture through which the shell portion of the socket adapter extends. In both ringless and ring style socket housings, a separate sealing ring is mounted about a end mounting flange at the outer end of the shell to lockably mount a watthour meter to the socket adapter.

However, since the shell portion of such socket adapters extends outward from the cover of the socket housing, the plastic construction of the shell and the shoulder between the shell and the enlarged peripheral edge flange of the base presents an inviting location for tampering with the socket. A person seeking to tap unmetered power from the socket can drill a hole in the plastic sidewall of the shell portion of the socket adapter and insert a wire therethrough into contact with a line contact in the socket adapter. Alternately, a heated wire may be placed in contact with the sidewall of the shell to melt the plastic shell and to enable the wire to be forced inside the socket adapter. Careful manipulation of the wire can make a connection with a line contact within the socket adapter thereby providing unmetered power.

The shoulder between the shell and the peripheral edge flange of the base of the socket adapter presents another area for possible tampering. In a ringless style socket, a small gap can be formed between the sidewall of the shell and the peripheral edge of the opening in the cover of the socket housing thereby exposing a portion of the peripheral edge of the base through which a heated wire can be forced to connect to a line contact within the socket housing. In a ring style socket adapter employing sealing rings, manufacturing tolerances in the sealing rings and the socket adapter itself can create small gaps between the sealing ring and the exterior surface of the sidewall of the shell, again providing an opportunity for insertion of a heated wire through the shell and/or base of the socket adapter into the interior of the socket housing.

What is needed is a watthour meter socket adapter having improved tampering resistance and tampering detection. Thus, it would be desirable to provide a watthour meter socket adapter having improved tamper resistance which does not require extensive modification to the existing socket adapter design. It would also be desirable to provide a watthour meter socket adapter having improved tamper resistance which can be manufactured at a low cost and which can be easily used to provide tamper resistant features for such socket adapters.

SUMMARY OF THE INVENTION

The present invention is a watthour meter socket adapter having improved tamper resistance and tampering detection. According to the present invention, a hardened metallic ring is mounted over the exterior sidewall of the shell portion of a watthour meter socket adapter. The ring is disposed between the exterior watthour meter mounting flange on the shell portion of the socket adapter and the peripheral edge flange of the base of the socket adapter and completely encloses the sidewall of the shell portion of the socket adapter.

In a preferred embodiment, the metallic ring is formed of a band of hardened steel having opposed ends overlapped and non-removably secured together by joining means. In one embodiment, the joining means comprises spot welds formed through the overlapped portions of the opposed ends of the band.

In another embodiment suited for use with ringless style socket housings, the metallic ring has an edge flange formed at one side edge which extends substantially perpendicularly from the main surface of the ring. The edge flange overlies the peripheral edge portion of the base of the socket adapter extending outward from the sidewall of the shell of the socket adapter and closes off any potential gaps which may be formed between the socket adapter and the peripheral edge of the opening in the cover of the socket housing.

According to the present invention, a unique method of constructing a tamper resistant socket adapter is also disclosed. According to the method of the present invention, a hardened metallic band is formed into a ring and mounted over the exterior surface of the shell portion of a socket adapter prior to the joining the shell portion to the base portion of the socket adapter. When the shell and base portions are joined together, the metallic ring is fixedly mounted between the exterior end mounting flange of the shell portion of the socket adapter and the peripheral edge flange of the base. The metallic ring, in one embodiment, is formed by overlapping opposed ends of a metallic band and joining the overlapped ends together by welding or other suitable means.

The electric watthour meter socket adapter of the present invention provides improved tamper resistance at a low cost and without any modification to existing socket adapters. The improved tamper resistance is provided by use of a hardened metallic ring which completely covers the shell portion of the socket adapter and is fixedly mounted between the end mounting flange of the shell portion of the socket adapter and the peripheral edge flange of the base of the socket adapter. In this configuration, the metallic ring engages the fastener employed to attach a ground strap to the shell portion of the adapter thereby maintaining the metallic ring in a grounded state at all times. The metallic ring is easily inserted over the exterior surface of the shell portion of the socket adapter prior to joining the shell to the base portion of the socket adapter.

The ring may be provided with a perpendicular edge flange to provide enhanced tamper resistance for socket adapters employed with ringless style socket housings.

The metallic ring also provides an indication of tampering with the adapter due to its non-rotatable mounting on the adapter and the gap formed between the ring and the adjacent side wall of the adapter housing.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1:
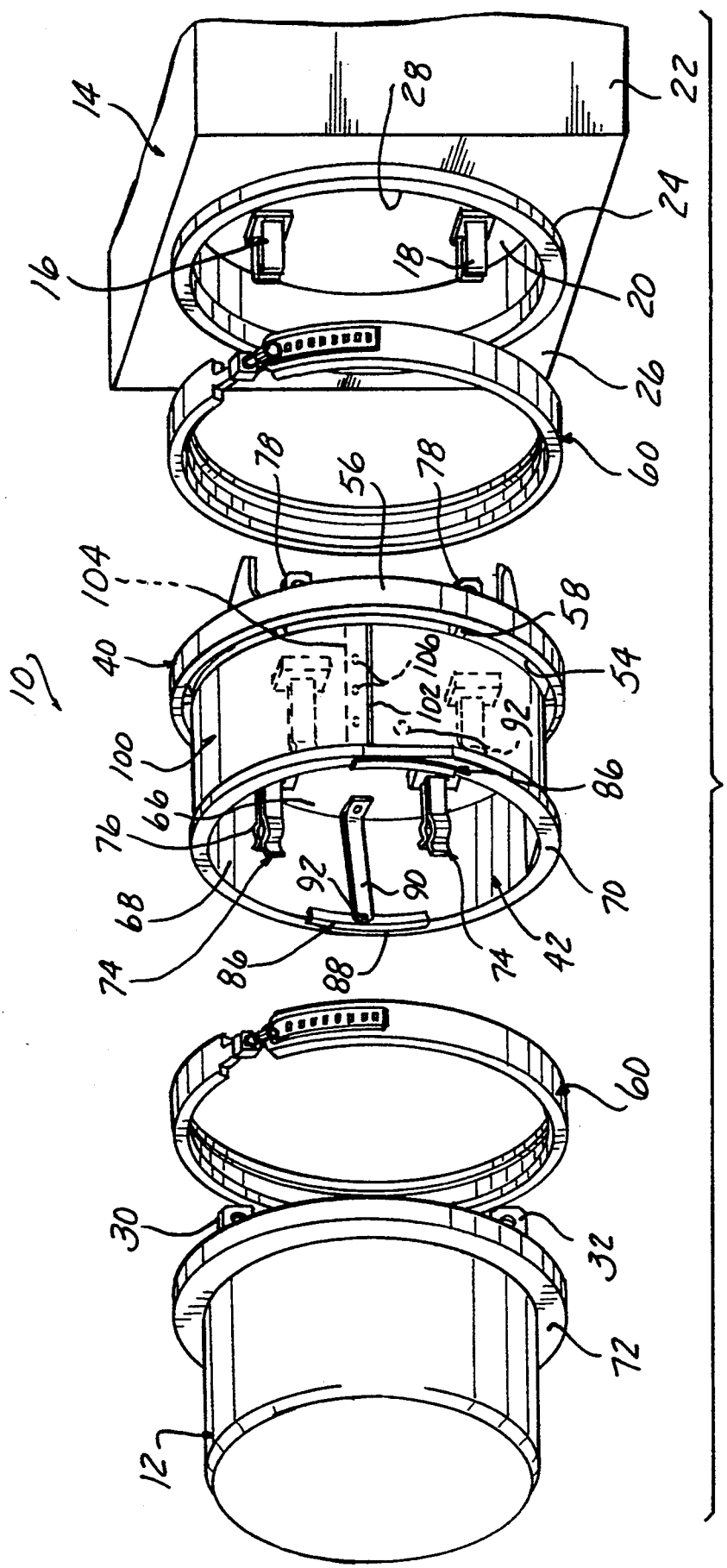
FIG. 1 is an exploded perspective view of a watthour meter socket adapter having a first embodiment of a tamper resistant ring of the present invention mounted thereon.
Figure 2:
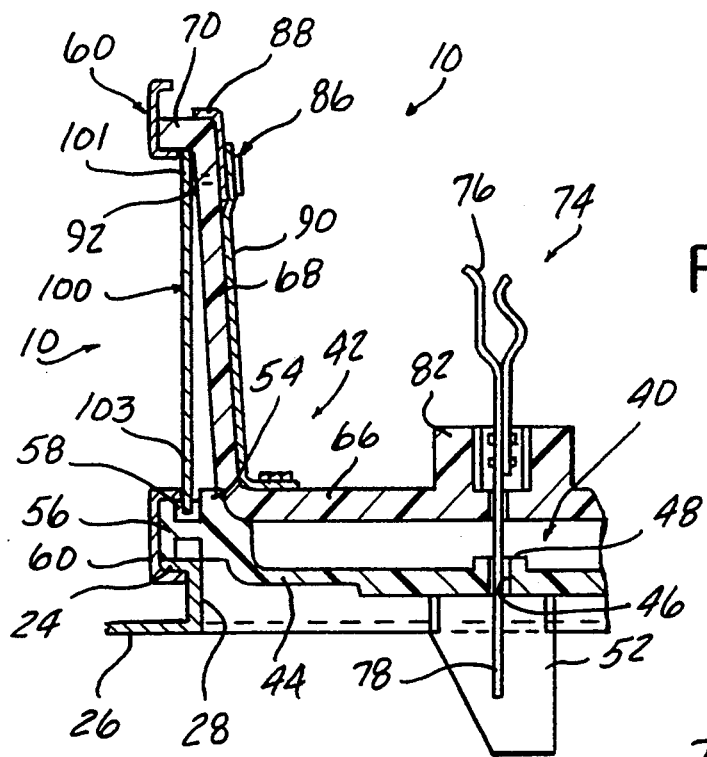
FIG. 2 is a partial, cross sectional view through the socket adapter shown in FIG. 1 depicting the mounting of the first embodiment of the tamper resistant ring on the socket adapter.

In order to better describe and appreciate the advantages of the present invention, a description of the conventional construction of an electric watthour meter socket adapter or socket extender/adapter, both hereafter referred to as a socket adapter, will be provided with reference to FIGS. 1, 2, 3 and 4. A conventional socket adapter 10, as shown in FIG. 1, is designed to receive a conventional electric watthour meter 12 in a snap-in connection via mating contacts. The socket adapter 10 also includes contacts which plug into mating contacts in a watthour meter socket 14. The number of contacts on the socket adapter 10, the watthour meter 12 and the socket 14 will vary depending upon the type of electric service at a particular user site. FIG. 1 depicts, by way of example only, a single phase electric service in which the socket 14 includes two pairs of contacts 16 and 18, only one of each pair being shown in FIG. 1. The pair of contacts 16 are connected to the electric power line conductors; while the pair of contacts 18 comprise load contacts which are connected to the user site electrical distribution circuit. The pairs of contacts 16 and 18 in the socket 14 are fixedly mounted on a back wall 20 of a conventional socket housing 22. The housing 22 shown in FIGS. 1 and 2 is a ring-style socket in which a raised mounting flange 24 is formed on the front cover 26 of the socket housing 22 and is spaced a short distance from the surface of the cover 26. The mounting flange 24 surrounds an aperture 28 through which the socket adapter 10 is removably disposed, as described hereafter.

As shown in FIG. 1, the conventional watthour meter 12 has two pairs of outwardly extending blade-type terminals, 30 and 32, only one of each pair being depicted. The socket adapter 10 is designed to interconnect the line contacts 16 in the socket 14 with the terminals 30 on the watthour meter and to connect the terminals 32 on the watthour meter 12 with the load contacts 18 in the socket 14 to complete an electric circuit through the watthour meter 12 between the line and load power conductors.

Figure 3:
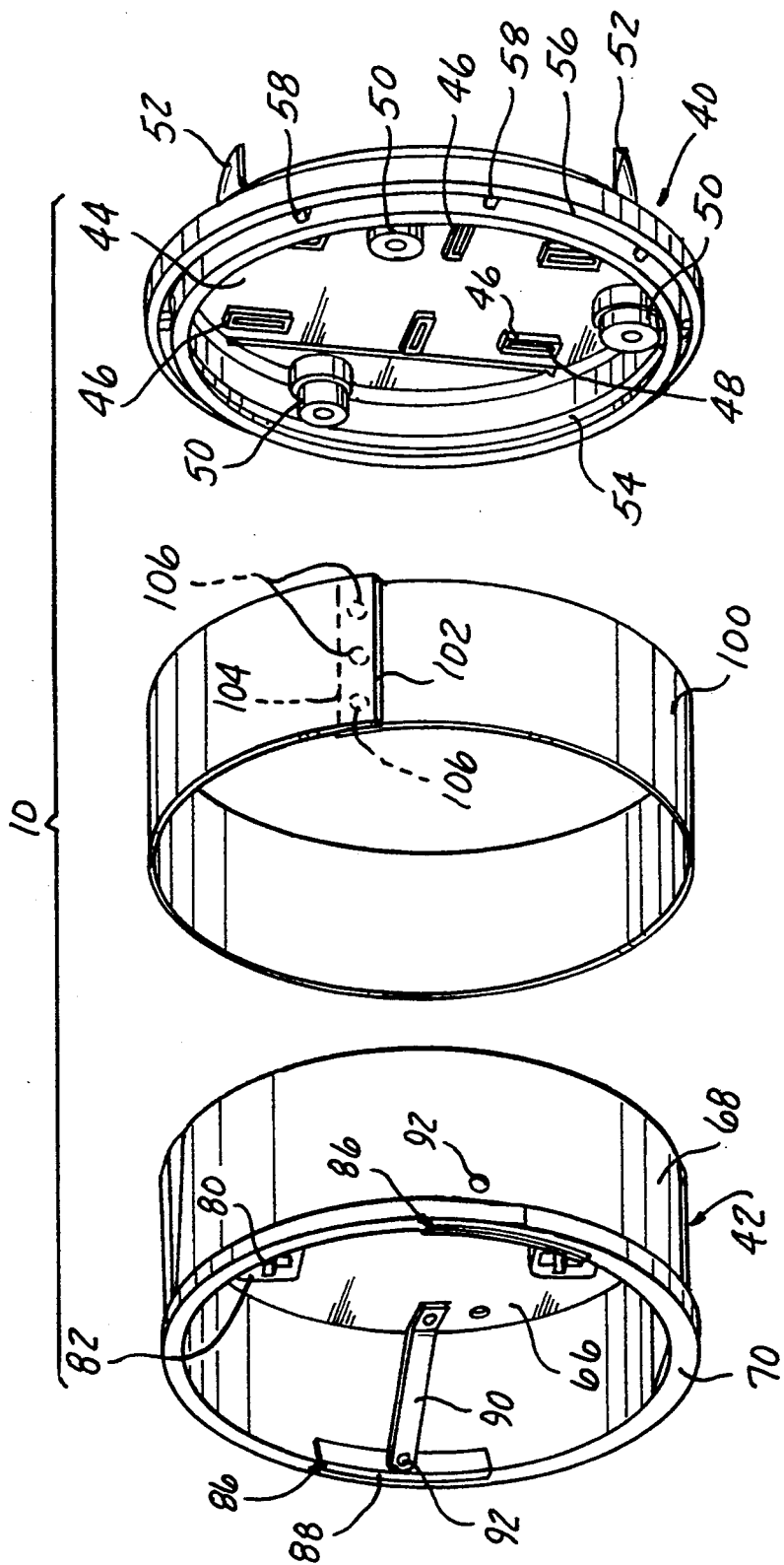
FIG. 3 is an exploded perspective view showing the assembly of a socket adapter having the first embodiment of a tamper resistant ring of the present invention mounted thereon.

As shown in FIGS. 1, 2, and 3, the socket adapter 10 includes a base portion 40 and a shell portion 42 which are fixedly joined together by suitable means, such as fasteners, not shown. The base 40 has a central wall 44 of generally circular shape. A plurality of generally rectangular projections 46 are formed on the wall 44 and have a slot 48 formed therein which extends completely through each projection 46 and the wall 44 to receive a contact therethrough, as described hereafter. A plurality of bosses 50 are formed on and extend outward from one surface of the wall 44. Through bores are formed in each boss 50 for receiving a fastener to join the shell 42 to the base 40. A plurality of outwardly extending legs 52 are formed on a back surface of the wall 44 and are provided in an appropriate number and are spaced from one of the contacts which extends through the base 40.

An annular raised inner peripheral edge flange 54 is formed on the base 40 and extends outward from one surface of the wall 44. An outer peripheral edge flange 56 is spaced radially outward from the inner flange 54. A plurality of circumferentially spaced ribs 58 are formed on the base 40 and extend radially between the inner and outer peripheral edge flanges 54 and 56.

The inner peripheral edge flange 54 on the base 40 forms a seat for receiving a peripheral edge portion of the shell 42 when the shell 42 is joined to the base 40. The outer peripheral edge flange 56 extends radially outward from the inner edge flange 54 and forms a mounting flange which mates with the mounting flange 24 on the cover 26 of the ring-style socket 14 shown in FIGS. 1 and 2. A conventional sealing ring 60, such as one sold by Ekstrom Industries, Inc., Farmington Hills, Mich., Model Number 10-9030, is employed to surround and lockingly join the outer peripheral edge flange 56 of the base 40 to the mounting flange 24 on the socket 14.

The shell 42 of the socket adapter 10 is formed with a bottom wall 66 and a generally annular sidewall 68 which tapers outwardly from one side of the bottom wall 66. The sidewall 68 terminates in an enlarged diameter exterior end mounting flange 70. The mounting flange 70 is designed to mate with a corresponding mounting flange 72 on a conventional watthour meter 12. A sealing ring 60 may be employed to encompass and lockingly engage the mounting flange 70 on the shell 42 and the mounting flange 72 on the watthour meter 12.

A plurality of contacts denoted generally by reference number 74 are mounted in the shell 42. The contact 74 may be provided in any number or type depending upon the type of electrical service provided to a particular user site. Each contact 74 has a female jaw portion 76 designed to receive a blade terminal 30 or 32 of a watthour meter 12 therein in a plug-in, snap-together connection. The opposite end of each contact 74 is formed as a male-type blade terminal 78 which extends through apertures 80 formed in raised bases 82 on the bottom wall 66 of the shell 42 as shown in FIG. 3. Each blade terminal 78 further extends through the slots 48 in the wall 44 of the base 40 and plugs into one of the contacts 16 and 18 in the socket 14.

A pair of grounding straps 86 are mounted on opposite sides of the shell 42. Each grounding strap 86 has a peripheral edge portion or strap 88 mounted on and extending over an edge of the exterior end mounting flange 70. A connector strap 90 is joined to the edge portion 88 and extends along the sidewall 68 of the shell 42 to a connection on the bottom wall 66 of the shell 42. A suitable fastener, such as a rivet 92 is employed to join the connector strap 90 to the edge portion 88. One end of the rivet 92 extends exteriorly of the sidewall 68 of the shell 42 as shown in FIGS. 2 and 3. The ground straps 86 provide a ground connection to the electric high voltage surge suppression circuit of the watthour meter 12.

As shown in FIG. 2, after the socket adapter 10 has been plugged into the socket 14, the sidewall 68 of the shell 42 projects outwardly from the cover 26 of the socket 14. Since the shell 42 and the base 40 are formed of a suitable plastic material, this length of exposed surface on the shell 42 provides an inviting location for tampering with the socket adapter 10 in an attempt to obtain unmetered power from the socket 14. A hole can be drilled in the sidewall 68 of the shell 42 and a wire inserted therethrough to connect with one of the line contacts 76 mounted within the shell 42.

Also, as shown in FIG. 2, in a ring-style socket 14, due to manufacturing tolerances, a small gap may be formed between the inner radial edge of the sealing ring 60 and the adjoining the inner peripheral edge 54 of the base 40. A heated wire may be forced through this gap melting the plastic of the shell 42 or the base 40 and then forced through the resulting opening into the socket 14 to make a connection with one of the line contacts 16 in the socket 14 to thereby obtain unmetered electrical power from the socket 14.

According to the present invention, these potential tampering areas are blocked by use of a novel tamper resistant ring 100 shown in a first embodiment in FIGS. 1, 2 and 3. The tamper resistant ring 100 is formed of a strip or band of metallic material, such as steel, stainless steel, etc., which has a suitable high hardness. The hardness may be provided during the formation of the material used to form the ring 100 or by suitable post formation heat treatment, case hardening, work hardening, etc., processes to increase the hardness of the ring 100 to the desired level. Preferably, the ring 100 has a hardness of between 37 to 41 Rc in a work hardened condition.

The band is then rolled, for example, into an annular shape. The ring 100 has opposed first and second ends 102 and 104 which are arranged in an overlapped position, as shown in FIGS. 1 and 3 when the band is formed into an annular ring shape. Suitable joining means are employed to fixedly secure the overlapped ends 102 and 104 of the ring 100 together in a predetermined diameter which is approximate the diameter of the outer end portion of the sidewall 68 of the shell 42 immediately adjacent the end mounting flange 70 on the shell 42. This construction enables the ring 100 to be slidably inserted over the sidewall 68 of the shell 42, as shown in FIG. 3, with one edge 101 disposed into close proximity with the exterior end of the sidewall 68 as shown in FIG. 2. Since the sidewall 68 of the shell 42 tapers outward from the bottom wall 66, the opposite edge 103 of the ring 100 will be spaced a short distance from sidewall 68 of the shell 42 as also shown in FIG. 2 when the opposite edge 103 slidably mates with flange 54 of base 40.

Any suitable joining means may be employed to fixedly and non-removably attach the overlapped ends 102 and 104 of the ring together. By way of example only, in a preferred embodiment, the joining means comprises spot welds 106 which are formed between the overlapped ends 102 and 104 of the ring 100.

In constructing the socket adapter 10 with the tamper resistant ring 100, as shown in FIG. 6, prior to the joining of the shell 42 to the base 40, the ring 100 which has been formed, as described above, in the desired diameter with its ends 102 and 104 fixedly joined together in an overlapped relationship, is slidably inserted over the sidewall 68 of the shell 42 until one edge 101 of the ring 100 engages the back surface of the end mounting flange 70 on the shell 42. The shell 42 is then joined to the base 40 by means of fasteners, not shown, which extend through apertures in the bottom wall 66 of the shell 42 and engage the bosses 50 in the base 40. In this position, one edge 103 of the ring 100 will forcibly engage the ribs 58 extending between the inner and outer peripheral edge flanges 54 and 56, respectively, of the base 40, as shown in FIG. 2. The ring 100 preferably has a width slightly larger than the distance between the flange 70 and the ribs 58 so as to cause deformation of the ribs 58 when the shell 42 is joined to the base 40. The ribs 58 thus apply constant pressure on the ring 100. This fixed mounting of the ring 100 between the flange 70 and the ribs 58 prevents the ring 100 from rotating about the sidewall 68 of the shell 42. However, due to the circular shape of the tamper resistant, hardened ring 100, any attempt to drill a hole in the ring 100 will cause the drill to walk or move along the circular ring 100 without breaking through the ring 100. Further, since a major portion of the ring 100 is spaced a short distance from the adjoining sidewall 68 of the shell 42, any attempt to tamper with the ring 100 by means of punching a small hole prior to drilling a larger hole in the ring 100 will cause a denting or deformation of the ring 100 thereby providing clear evidence of any attempt to tamper with the socket adapter 10.

As also shown in FIG. 2, the engagement of one edge of the ring 100 with the ribs 58 on the base 40 closes any gap which may exist between the sealing ring 60 and the inner peripheral edge flange 54 of the base 40. This closes off any opening through which a heated wire could be passed in an unauthorized attempt to obtain unmetered power from the socket 14.

It should also be noted in FIG. 2, when the ring 100 is mounted about the sidewall 68 of the shell 42, the ring 100 contacts the head of the fastener or rivet 92 employed to connect the two portions of the grounding strap 86 together. This effectively grounds the ring 100.

Figure 4:
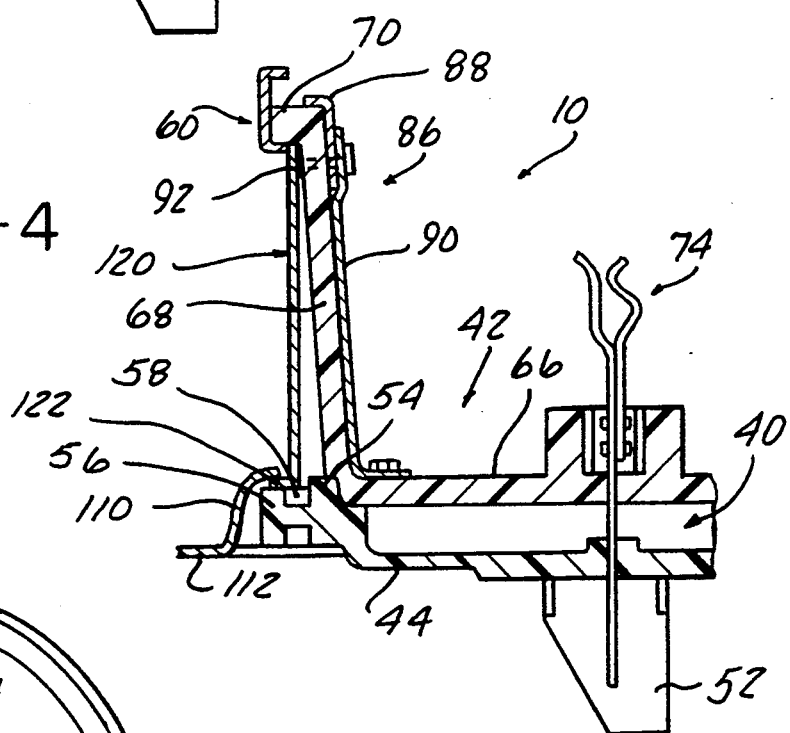
FIG. 4 is a partial cross sectional view through a socket adapter, similar to the socket adapter shown in FIG. 1, but depicting the socket adapter mounted on a ringless style socket housing.
Figure 5:
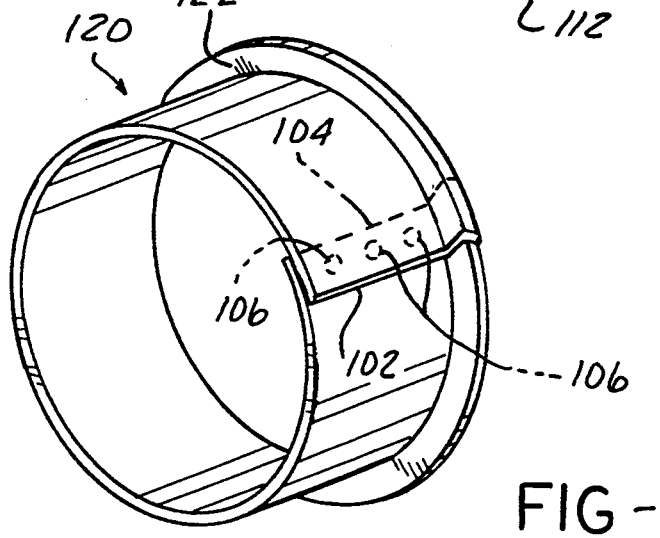
FIG. 5 is a perspective view of a second embodiment of a tamper resistant ring mounted on the socket adapter shown in FIG. 4.

FIGS. 4 and 5 depict another embodiment of a tamper resistant ring which is ideally suited for use with socket adapters 10 employed on ringless-style sockets. As shown in FIG. 4, in a ringless style socket, a raised annulus 110 is formed on the front cover 112 of the socket housing and surrounds an aperture through which the socket adapter 10 is inserted into a plug-in connection with the contacts in the socket housing. Since a larger gap may be formed in such a ringless-style socket between the inner edge of the annulus 110 surrounding the aperture in the front cover 112 and the adjacent sidewall 68 of the shell 42 and the inner peripheral flange 54 and ribs 58 of the base 40, a tamper resistant ring 120, shown in FIGS. 4 and 5, which is substantially the same as the ring 100 shown in FIGS. 1, 2 and 3 and described above, is provided with an additional, edge flange 122 which is formed on and extends perpendicularly outward from one annular edge of the ring 120. The flange 122 may be formed by rolling the flange 122 into the ring 120 during the rolling of the ring 120 into the annular shape. As shown in FIG. 4, when the ring 120 is mounted over the exterior surface of the sidewall 68 of the shell 42, the flange 122 covers the ribs 58, the outer peripheral flange 56 and inner peripheral flange 54 on the base 40 thereby closing any possible gap which may exist between the base 42 and the inner edge of the annulus 110 on the cover 112 of the socket housing. This provides additional tamper resistance for the socket adapter 10 in addition to that provided by the hardened ring 120 itself.

In summary, there has been disclosed a unique electric watthour meter socket adapter having improved tamper resistance and tampering detection. Such tamper resistance is provided by an annular hardened metallic ring which is mounted about the exterior surface of the sidewall of the shell of the socket adapter prior to joining the shell to the base of the socket adapter. The hardened tamper resistant ring covers the exposed plastic portions of the shell when the socket adapter is mounted in a meter socket. In addition, a perpendicular edge flange may be formed on one annular edge of the tamper resistant ring for use in socket adapters employed with ringless-style meter sockets. The tamper resistant ring of the present invention is simple in construction and may be used with any conventional watthour meter socket adapter or socket/extender without requiring any modifications to the socket adapter.

What is claimed is:

1. An electric watthour meter socket adapter comprising:
   a base and a hollow shell having an annular sidewall;
   the shell having first and second opposed ends, an annular mounting flange formed on the second end of the shell and extending radially outward from the sidewall of the shell, the base having a peripheral edge flange extending outward from a central portion of the base, the peripheral edge flange having a larger diameter than the diameter of the first end of the shell, the shell unitarily joined at the first end to the base and extending axially from the base;
   a plurality of electrical contacts mounted in the base and disposed within the shell for receiving an electrical device therein in a plug-in connection; and
   a metallic ring mounted between the peripheral edge flange of the base and the annular mounting flange of the shell and enclosing substantially all of the exterior surface of the sidewall of the shell.

2. The socket adapter of claim 1 wherein the metallic ring is formed of steel.

3. The socket adapter of claim 3 wherein the metallic ring is hardened.

4. The socket adapter of claim 1 wherein the metallic ring is formed as a continuous band.

5. The socket adapter of claim 1 wherein the metallic ring has a hardness of between 37 to 41 Rc.

6. The socket adapter of claim 1 wherein:
   the shell includes a ground strap mounted on the annular flange and extending interiorly into the shell;
   a metallic fastener extending through the sidewall of the shell for fixedly mounting the ground strap to the shell; and
   the metallic ring member contacting the metallic fastener when mounted over the sidewall of the shell to electrically connect the metallic ring member to the ground strap.

7. The socket adapter of claim 1 wherein the metallic ring comprises:
   a band having first and second opposed ends;
   the band being formed in a generally annular shape such that the first and second ends are disposed in an overlapping relationship; and
   means for fixedly joining the overlapped first and second ends together.

8. The socket adapter of claim 7 wherein the joining means comprises:
   spot welds formed between the overlapped first and second ends of the band.

9. The socket adapter of claim 8 wherein the first and second ends of the band are overlapped to form the band at a predetermined diameter approximate the outer diameter of the sidewall of the shell.

10. The socket adapter of claim 1 wherein the metallic ring further comprises:
    an edge flange formed along one annular edge of the ring and extending substantially perpendicular from a main surface of the ring, the edge flange disposed in registry with and covering substantially all of a peripheral edge flange of the base when the metallic ring is mounted over the sidewall of the shell.

11. The socket adapter of claim 1 wherein;
    the sidewall of the shell tapers inward from the second end to the first end; and
    the metallic ring has a constant diameter such that one portion of the metallic ring is spaced from a portion of the tapering sidewall of the shell and an opposed portion of the metallic ring is disposed in closed proximity with the second end of the sidewall of the shell.

12. The socket adapter of claim 1 wherein;
    the annular mounting flange on the base includes spaced, inner and outer peripheral flanges;
    an annular slot formed between the inner and outer peripheral flanges; and
    one end of the metallic ring seated in the slot.

13. The socket adapter of claim 12 further comprising;
   at least one radially extending rib formed in the slot extending between the inner and outer peripheral flanges;
   the at least one rib deformably engaged with the metallic ring to resist rotation of the metallic ring relative to the base and shell.

14. A method of manufacturing a tamper resistant electric watthour meter socket adapter comprising the steps of:
   forming a base with a bottom wall, a peripheral flange formed about and extending outward from the periphery of the bottom wall, and a plurality of apertures formed in and extending through the bottom wall;
   forming a shell having an exterior sidewall terminating in a radially outward extending exterior end mounting flange having a larger diameter than the diameter of the sidewall;
   mounting electrical contacts in the bottom wall of the base with the contacts extending into the shell;
   forming an annular ring of a hardened metallic material; and
   mounting the annular ring over the sidewall of the shell between the peripheral flange of the base and the exterior end mounting flange of the shell such that the annular ring extends over and substantially encloses all of the sidewall of the shell extending between the peripheral flange on the base and the exterior end mounting flange on the shell.

15. The method of claim 14 further comprising the step of:
   forming the annular ring of a hardened steel.

16. The method of claim 14 further comprising the step of:
   forming the annular ring of an elongated band having first and second opposed ends which are overlapped to form the ring in a generally circular shape of a diameter approximate the outer diameter of the sidewall of the shell; and
   fixedly joining the overlapped ends of the band together.

17. The method of claim 16 wherein the step of fixedly joining the overlapped ends of the band together further comprises the step of spot welding the overlapped ends of the band together.

18. The method of claim 14 further comprising the steps of:
   forming the peripheral flange on the base as an inner peripheral flange formed about the periphery of the bottom wall, an outer peripheral flange spaced radially outward from the inner peripheral flange and ribs extending between the inner and outer peripheral flanges.

19. The method of claim 14 further comprising the step of forming a flange on one annular edge of the ring extending substantially perpendicular from the one annular edge of the ring.

* * * * *